(12) United States Patent
Cohen et al.

(10) Patent No.: US 8,603,242 B2
(45) Date of Patent: *Dec. 10, 2013

(54) FLOATING SEMICONDUCTOR FOILS

(76) Inventors: Uri Cohen, Palo Alto, CA (US);
Michael Roitberg, Atlantic Beach, NY (US)

(*) Notice: Subject to any disclaimer, the term of this patent is extended or adjusted under 35 U.S.C. 154(b) by 960 days.

This patent is subject to a terminal disclaimer.

(21) Appl. No.: 12/713,170

(22) Filed: Feb. 25, 2010

(65) Prior Publication Data

US 2010/0288189 A1  Nov. 18, 2010

Related U.S. Application Data

(60) Provisional application No. 61/208,655, filed on Feb. 26, 2009.

(51) Int. Cl.
*C30B 29/06* (2006.01)

(52) U.S. Cl.
USPC .............. 117/70; 117/71; 117/72; 117/73; 117/74; 117/75

(58) Field of Classification Search
USPC .............................. 117/70, 71, 72, 73, 74, 75
See application file for complete search history.

(56) References Cited

U.S. PATENT DOCUMENTS

| | | | |
|---|---|---|---|
| 2,911,759 A | 11/1959 | Pilkington et al. | |
| 2,990,372 A | 6/1961 | Pinter et al. | 252/62.3 |
| 3,097,068 A | 7/1963 | Litz et al. | 23/223.5 |
| 3,607,115 A | 9/1971 | Bleil | 23/273 |
| 3,681,033 A | 8/1972 | Bleil | 23/273 |
| 3,759,671 A | 9/1973 | Bleil | 23/301 |
| 3,933,981 A | 1/1976 | Wakefield et al. | 423/348 |
| 4,027,053 A | 5/1977 | Lesk | 427/53 |
| 4,193,974 A | 3/1980 | Kotval et al. | 423/348 |
| 4,264,407 A | 4/1981 | Shudo et al. | 156/617 |
| 4,468,281 A | 8/1984 | Bender et al. | 156/624 |
| 4,599,132 A | 7/1986 | Jewett et al. | 156/617 |
| 4,650,541 A | 3/1987 | Ciszek | 156/620 |
| 4,690,797 A | 9/1987 | Eyer et al. | 419/23 |

(Continued)

FOREIGN PATENT DOCUMENTS

| | | | | |
|---|---|---|---|---|
| WO | WO 2005/117079 A1 | 12/2005 | | H01L 21/208 |
| WO | WO 2005/122287 A1 | 12/2005 | | H01L 31/18 |
| WO | WO 2007/112592 A1 | 10/2007 | | C01B 33/037 |
| WO | WO 2010/098676 A1 | 9/2010 | | C01B 33/02 |

OTHER PUBLICATIONS

Si-Sn phase diagram in Metals Handbook, $8^{th}$ Edition, vol. 8, American Society for Metals, 1973, pp. 334 and 374.

(Continued)

*Primary Examiner* — Bob M Kunemund

(57) ABSTRACT

One embodiment of the present invention is a method for producing a silicon (Si) and/or germanium (Ge) foil, the method including: dissolving a Si and/or Ge source material in a molten metallic bath at an elevated temperature $T_2$, wherein the density of Si and/or Ge is smaller than the density of the molten metallic bath; cooling the molten metallic bath to a lower temperature $T_1$, thereby causing Si and/or Ge to separate out of the molten metallic bath and to float and grow as a Si and/or Ge foil on a top surface of the molten metallic bath; and separating the floating Si and/or Ge foil from the top surface of the molten metallic bath.

29 Claims, 5 Drawing Sheets

(56) References Cited

U.S. PATENT DOCUMENTS

| | | | | |
|---|---|---|---|---|
| 4,778,478 | A | 10/1988 | Barnett | 437/5 |
| 5,314,571 | A | 5/1994 | Ciszek | 117/60 |
| 5,320,984 | A * | 6/1994 | Zhang et al. | 438/488 |
| 5,326,719 | A | 7/1994 | Green et al. | 437/119 |
| 5,363,798 | A * | 11/1994 | Yoder | 117/89 |
| 5,490,477 | A | 2/1996 | Knauth et al. | 117/43 |
| 5,544,616 | A | 8/1996 | Ciszek et al. | 117/60 |
| 6,093,244 | A | 7/2000 | Easoz et al. | 117/15 |
| 2002/0112660 | A1 | 8/2002 | Nishida et al. | 117/54 |
| 2004/0040885 | A1 | 3/2004 | Boyle et al. | 206/711 |
| 2004/0118336 | A1 | 6/2004 | Mizutani et al. | 117/54 |
| 2005/0109388 | A1 | 5/2005 | Murakami et al. | 136/255 |
| 2007/0098612 | A1 | 5/2007 | Lord | 423/215.5 |
| 2007/0128830 | A1 | 6/2007 | Xie | 438/458 |
| 2007/0248521 | A1 | 10/2007 | Kutsovsky et al. | 423/324 |
| 2009/0056805 | A1 | 3/2009 | Barnett et al. | 136/256 |
| 2011/0280784 | A1 | 11/2011 | Ydstie et al. | 423/348 |

OTHER PUBLICATIONS

In-Si phase diagram of R.W. Olesinski et al., in Binary Alloy Phase Diagrams, II Ed., edited by T.B. Massalski, vol. 3, 1990, pp. 2292-2293.

Binary Alloy Phase Diagrams, $2^{nd}$ Edition, vol. 3 (1990), Edited by T. D. Massalski et al., ASM International, Si-Sn and In-Si phase diagrams.

"Liquid Phase Epitaxy of Electronic, Optical and Optoelectronic Materials", Edited by P. Capper and M. Mauk, John Wiley & Sons, 2007, Chapters 4-5, pp. 85-178.

"Silicon Info: Ribbon and Sheet Growth", by T. Ciszek, Siliconsultant (Evergreen), Online link: http://www.siliconsultant.com/SIribbonGr.htm Updated May 3, 2007.

"String Ribbon Silicon Solar Cells With 17.8% Efficiency", by D.S. Kim et al., Presented at the 3rd World Conference on Photovoltaic Energy Conversion; Osaka, Japan; May 11-18, 2003.

"Ribbon-Growth-On-Substrate: Progress in High-Speed Crystalline Silicon Wafer Manufacturing", by A. Schönecker et al., ECN-RX-02-023, $29^{th}$ IEEE Photovoltaic Specialist Conference, May 20-24, 2002, New Orleans, USA.

"Silicon Liquid Phase Epitaxy for Epilift Solar Cells", by K. J. Weber et al., Paper 4P-B4-31, $3^{rd}$ World Conference on Photovoltaic Conversion, May 11-18, 2003, Osaka, Japan.

"The Potential of Thin-Film Crystalline Silicon Solar Cells", by Koen Snoeckx et al., Semiconductor International, Jun. 1, 2007.

"Silicon Thin-Film Solar Cells", by IMEC vzw., Solar Cells Technology Group, Advances in OptoElectronics, vol. 2007, Article ID 36970.

"Morphology of Silicon Epitaxial Layers Crown by Undercooling of a Saturated Tin Melt", by B. J. Baliga, Journal of Crystal Growth 41 (1977), pp. 199-204.

"Kinetics of the Epitaxial Growth of Silicon from a Tin Melt", by B. J. Baliga, Journal Electrochemical Society, vol. 124(10), Oct. 1977, pp. 1627-1631.

"Liquid Phase Epitaxial Silicon Diodes: N-Epitaxial on Boron-Doped Substrates Layers", by B. J. Baliga, Journal Electrochemical Society, vol. 127(5), May 1980, pp. 1168-1172.

"Boron Autodoping during Silicon Liquid Phase Epitaxy", by B. J. Baliga, Journal Electrochemical Society, vol. 128(1), Jan. 1981, pp. 161-165.

"High Lifetime Silicon Liquid Phase Epitaxy", by B. J. Baliga, Journal Electrochemical Society, vol. 129(3), Mar. 1982, pp. 665-666.

"Silicon Liquid Phase Epitaxy A Review", by B. J. Baliga, Journal Electrochemical Society, vol. 133(1), Jan. 1986, pp. 5C-14C.

"Improved Silicon Thin Film Growth on Glass Substrates by Periodic Regrowth", by Z. Shi and M. A. Green, Journal Electrochemical Society, vol. 140(11), Nov. 1993, pp. 3290-3293.

"Si-Ge-Metal Ternary Phase Diagram Calculations", by J. P. Fluerial et al., Journal Electrochemical Society, vol. 137(9), Sep. 1990, pp. 2928-2937.

"Optimum Conditions for Baking of Indium", by M. Janson, Journal Electrochemical Society, vol. 130(4), Apr. 1983, pp. 960-962.

"Liquid Phase Epitaxial Growth of Silicon in Selected Areas", by H. J. Kim, Journal Electrochemical Society, vol. 119(10), Oct. 1972, pp. 1394-1398.

"Liquid-Phase Epitaxial Growth of Gallium-Doped Silicon", by B. E. Sumner, Journal Electrochemical Society, vol. 125(11), Nov. 1978, pp. 1817-1824.

"Modified technique of using conventional slider boat for liquid phase epitaxy of silicon for solar cell application", by D. Majumdar et al., Bul. Meter. Sci., vol. 26, No. 6, Oct. 2003, pp. 643-654.

"Refining of Si by the Solidification of Si-Al Melt with Electromagnetic Force", by T. Yoshikawa et al., ISIJ International, vol. 45 (2005), No. 7, pp. 967-971.

"Innovative Approaches to Low Cost Module Manufacturing of String Ribbon Si PV Modules", by J. I. Hanoka, NREL/SR-520-36908, Oct. 2004.

"Improvements in the Horizontal Ribbon Growth Technique for Single Crystal Silicon", by B. Kudo, Journal of Crystal Growth 50 (1980), pp. 247-259.

"A New Method for Growing Crystal Ribbons", by C. E. Bleil, Journal of Crystal Growth 5 (1969), pp. 99-104.

"Enhanced crystallinity of silicon films deposited by CVD on liquid layers (CVDOLL process): Silicon on tin layers in the presence of hydrogen chloride", by M. W. M. Graef et al., Journal Applied Physics, vol. 48, No. 9, Sep. 1977, pp. 3937-3940.

"Silicon Films on Foreign Substrates for Solar Cells", by T. L. Chu, Journal of Crystal Growth 39 (1977, pp. 45-60.

"17% Efficient Thin Film Silicon Solar Cell by Liquid Phase Epitaxy", by K. J. Weber et al., $24^{th}$ Photovoltaic Specialist Conference, 1994, pp. 1391-1393.

"VLSI Technology", Edited by S. M. Sze, McGraw-Hill Book Company (1983), pp. 32-37, 51.

* cited by examiner

FLOATING SEMICONDUCTOR FOILS

This Application claims the benefit under 35 U.S.C. 119(e) of U.S. Provisional application No. 61/208,655, filed on Feb. 26, 2009, which provisional application is incorporated herein by reference in its entirety.

TECHNICAL FIELD OF THE INVENTION

One or more embodiments of the present invention relate to method and apparatus for fabricating a semiconductor foil (or film, or ribbon, or panel, or sheet).

BACKGROUND OF THE INVENTION

Semiconductors such as silicon (Si), germanium (Ge), GaAs, and InP, have many uses. For example, virtually the entire microelectronics industry is based on Si, Ge, and GaAs. In addition, due to a need for renewable sources of energy, cost effective methods for fabricating solar panels have become important. Silicon or GaAs solar panels are usually fabricated from highly polished single-crystalline or polycrystalline round wafers sliced from single-crystalline or polycrystalline Si ingots. Sawing, polishing, and etching the wafers results in a costly (~80%) loss, or "kerf," of Si (or GaAs) material. In addition, the process of growing single-crystalline or polycrystalline ingots is energy-intensive and costly. Furthermore, the size of the round wafers is limited, having a typical size of less than 200 mm or 300 mm in diameter. Therefore, many wafers are required to assemble one solar panel (or module)—a typical panel has dimensions of about 1.5 meters in length and about 1.0 meter in width. Furthermore, in order to minimize module efficiency losses due to unused area between round wafers, the round ingots are first machined into elongated semi-square rods prior to their being sliced to form semi-square wafers. This machining results in a further (~20%) Si or GaAs, or Ge material loss. Alternatively, round wafers are packaged into the panels, thereby reducing the total panel conversion efficiency due to unutilized area between the round wafers which is not covered by solar cells. LCD display panels are fabricated from rectangular Si panels, but the silicon material is amorphous or, at best, small grain (<0.1 μm) ("microcrystalline") Si material. In general, amorphous and/or small grain polycrystalline Si produces poor transistor performance, and low solar cell conversion efficiency. Single-crystalline, or large grain polycrystalline Si panels, offer superior solar cell conversion efficiency and/or LCD panel performance.

Other semiconductor wafer techniques do not require growing semiconductor ingots and then slicing the ingots into wafers. Conventional semiconductor foil or ribbon-edge growth methods, such as Edge-Defined Film Growth ("EFG"), Dendritic Web Ribbon Growth, Capillary Die Growth (of tubes), or Edge String Supports, involve growing a semiconductor ribbon or film from its melt, at a temperature slightly above its melting temperature (>1,414° C. for Si). In such ribbon-edge growth methods, the foil or ribbon grows from its edge, across a relatively small ribbon edge-liquid interfacial area, and along a direction parallel to the ribbon's length. The ribbon width is limited (only about 8 cm wide in string ribbon), and the growth rate along the length of the ribbon is only about 2-8 cm/min. As a result, ribbon-edge growth methods suffer low throughput of about 0.002 m$^2$/min (20 cm$^2$/min) for a string ribbon. Furthermore, the molten source semiconductor material must be of high purity (or grade) and, therefore, is costly. As a result, conventional ribbon-edge growth methods require extensive energy usage due to the high operational temperature, high production costs, and low throughput.

SUMMARY OF THE INVENTION

One or more embodiments of the present invention satisfy one or more of the above-identified needs.

One embodiment of the present invention is a method for producing a semiconductor foil, the method including: dissolving a semiconductor source material in a molten metallic bath at an elevated temperature $T_2$, wherein the density of the semiconductor is smaller than the density of the molten metallic bath; cooling the molten metallic bath to a lower temperature $T_1$, thereby causing the semiconductor to separate out of the molten metallic bath and to float and grow as a floating semiconductor foil on a top surface of the molten metallic bath; and separating the floating semiconductor foil from the top surface of the molten metallic bath. In one such embodiment, the molten metallic bath comprises one or more metals such as indium (In), (Sn), gallium (Ga), aluminum (Al), zinc (Zn), and lead (Pb).

DETAILED DESCRIPTION

Figure 1A:
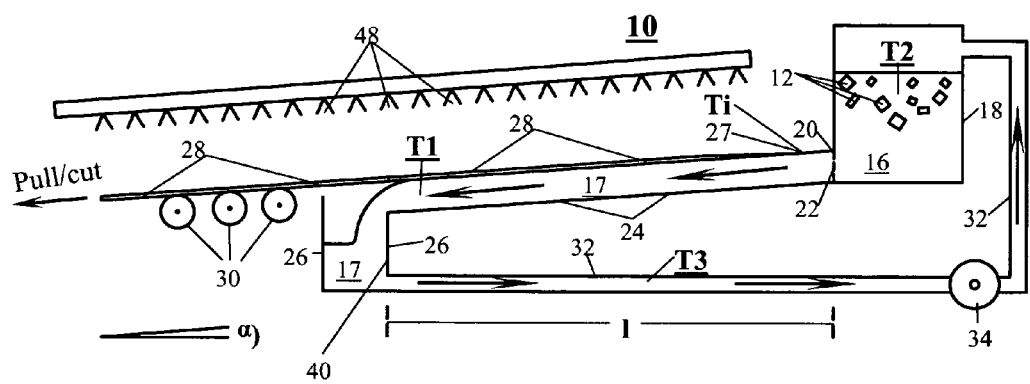
FIG. 1A shows a schematic side view cross-section of an apparatus for pulling semiconductor ribbons in accordance with one or more embodiments of the invention.

One or more embodiments of the invention are methods that include dissolving a semiconductor source material in a molten metallic bath at a temperature $T_2$ below the melting point of the semiconductor to provide a saturated, or close to saturated, molten metallic solution. In accordance with one or more such embodiments, the semiconductor source (in the form of, for example and without limitation, granules, lumps, slugs, shots, chunks, powder, or wafers) is dissolved in the molten metallic bath at $T_2$ until the molten metallic bath reaches saturation, or close to saturation solution. Then the saturated molten metallic solution is cooled to a lower temperature $T_1$ (i.e., $T_2 > T_1$). In other embodiments, the semiconductor source is dissolved at $T_2$ to attain a highly concentrated solution (a concentration which is lower than the solubility concentration at $T_2$, but which is higher than the solubility of the source material at $T_1$). As the molten metallic solution cools down, dissolved semiconductor separates out of the saturated (or highly concentrated) molten metallic bath (or solution) and, due to the lower density of the semiconductor, compared with that of the molten metallic bath, the semiconductor floats to the top surface of the molten metallic bath to form a floating semiconductor foil (or a film, or a ribbon, or a panel, or a sheet) at the top surface of the molten metallic bath. The floating solid semiconductor is then pulled along a direction substantially parallel to the top surface of the molten metallic bath, or along a direction forming a small angle with the top surface of the molten metallic bath. In other embodiments, the floating semiconductor foil (or film, or ribbon, or panel, or sheet) is pulled or lifted along another direction, such as along a direction substantially normal to the surface of the molten metallic bath.

As used herein, the term foil means, and includes the following terms, singly or in combination, within its definition, a foil, a film, a ribbon, a panel, or a sheet. Similarly, the term ribbon means, and includes the following terms, singly or in combination, within its definition, a foil, a film, a ribbon, a panel, or a sheet; and the term panel means, and includes the following terms, singly or in combination, within its definition, a foil, a film, a ribbon, a panel, or a sheet.

In accordance with one or more embodiments of the present invention, nucleation and growth of the floating semiconductor foil occurs at a flat and smooth solid-liquid interface. As such, the growing foil is substantially free of interfacial stresses, and has a flat and smooth surface. Without interfacial stresses (which usually introduce a large number of defects, such as dislocations, voids, and small grain size), the growing foil is free to develop large and high quality grains, or even be substantially single-crystalline. As such, the growing semiconductor foil is substantially free of dislocations and other stress-related defects. With lower defects, a semiconductor foil grown in accordance with one or more embodiments of the present invention is believed to have greatly improved carrier mobilities and minority lifetimes which, in turn, facilitate fabrication of high efficiency and high performance solar cells.

In accordance with one or more embodiments of the present invention, the floating semiconductor foil (or film, or ribbon, or panel, or sheet) grows substantially along its thickness direction, i.e., a direction which is substantially parallel to the thickness of the floating foil. In accordance with one or more such embodiments, the growth of the semiconductor foil takes place across substantially the entire interfacial area between the floating solid foil and the top surface of the molten metallic solution. This interfacial area is a relatively very large area. Since the semiconductor foil fabricated in accordance with one or more of these embodiments needs only grow to its final thickness, the total throughput, or production rate, of the semiconductor foil can be much higher than rates achievable by conventional ribbon-edge growth methods, such as Edge-Defined Film Growth ("EFG"), Dendritic Web Ribbon Growth, Capillary Die Growth, or Edge Strings Supports. In such conventional edge-growth methods, the ribbon or film grows from its edge (which is across a relatively small ribbon edge-liquid interfacial area), along a direction parallel to its length. In general, the solidification rate from a semiconductor melt is larger than the growth rate from a solution. However, due to the much larger interfacial growth area of the entire foil fabricated in accordance with one or more embodiments of the present invention (when compared with the relatively much smaller ribbon edge interfacial area of conventional edge-growth methods), the overall throughput of foil (or film, or ribbon, or panel, or sheet) production can be significantly larger by using the methods in accordance with one or more embodiments of the present invention. Other advantages of one or more embodiments of the present invention over conventional edge-growth techniques include use of lower operational temperatures than the melting point of the semiconductor (thereby realizing cost and energy savings), and possible use of lower grade semiconductor source material. It is believed that the pulling (or lifting) rate of semiconductor foils in accordance with one or more embodiments of the invention may be as high as 0.1-1.0 meter/min, or higher. It is further believed that there may be no physical limits on the width and length of the grown semiconductor foils. It is further believed that semiconductor foils (or films, or ribbons, or panels, or sheets) grown in accordance with one or more such embodiments may be as wide as 1.0 meter, or wider, and that their length may be up to several meters, or longer. As a result, methods in accordance with one or more embodiments of the present invention may produce foils at throughputs of about 0.1-1.0 m$^2$/min (1,000-10,000 cm$^2$/min), or higher. For comparison, the throughput of conventional string Si ribbon methods is only about 20 cm$^2$/min.

In one embodiment, the saturated (or highly concentrated) molten metallic solution flows from the higher temperature $T_2$ toward the lower temperature $T_1$. As the flowing saturated (or highly concentrated) molten solution cools down, dissolved semiconductor separates out of the molten metallic solution, and floats to the top surface of the molten metallic bath to form a floating ribbon. The floating solid semiconductor ribbon is pulled-off from the top surface of the molten solution at the lower temperature $T_1$, along a direction substantially parallel to the top surface of the molten metallic bath, or along a direction forming a small angle with the top surface of the molten metallic bath.

In other embodiments, the saturated (or highly concentrated) molten solution is poured into trays, and either the trays are moved from a hot zone ($T_2$) toward a cooler zone ($T_1$), or one or more heating elements are moved along a length of the trays, thus producing gradual cooling of the saturated (or highly concentrated) molten solution. In other embodiments, both the trays and the one or more heating elements are moved relative to each other. In some embodiments, the trays are moved into a uniform cooler zone, and/or the heating elements are moved away from the trays, or toward the trays, to produce cooler or hotter zones, respectively, in the vicinity of the trays. In yet other embodiments, the heating power to the heating elements is gradually decreased, or shut off altogether. As a result, dissolved semiconductor separates out and floats to the top surface of the molten metallic bath to form panels having substantially the shape (such as width and length) of the trays. The floating solid semiconductor panels may then be pulled-off from the top surface of the molten metallic bath at a lower temperature ($T_1$) along a direction substantially parallel to the surface of the melt, or along a direction forming a small angle with the top surface of the molten bath. In other embodiments, the semiconductor panels may be lifted-off or raised from the top surface of the molten metallic bath along a direction substantially normal to the top surface of the molten metallic bath, or along other directions.

In accordance with one or more embodiments: (a) the semiconductor has a higher solubility at $T_2$ than at $T_1$ in the molten metallic bath (or medium), (b) the semiconductor has a lower density (or specific gravity) than that of the molten metallic bath, (c) the metals of the molten metallic bath have low solubilities in the solid semiconductor between temperatures $T_2$ and $T_1$, and (d) construction materials such as quartz, densified graphite (including graphite with CVD-coated carbon), pyrolitic (or glassy) carbon, tungsten, molybdenum, tantalum, titanium, silicon, silicon carbide, and sapphire may be used. Construction materials should be compatible with the molten metallic bath and the solid semiconductor (i.e., they do not substantially contaminate the molten metallic bath, and/or the solid semiconductor).

For example, the molten metallic bath (or medium) may comprise one or more metals chosen from a group consisting of indium (In), tin (Sn), gallium (Ga), aluminum (Al), zinc (Zn), and lead (Pb). Material costs and operational temperatures may be considered in deciding which material to utilize. For example, high purity zinc might be less expensive than high purity indium or tin, and the operational temperatures of molten zinc can be lower than that of tin. On the other hand, zinc impurities in Si may be more deleterious (or detrimental) for device performance than indium or tin impurities. Nevertheless, a controlled level of zinc impurity (or doping) might be beneficial if a p-type semiconductor, such as Si, Ge, GaAs, or InP foil is desirable. Intentional doping of the semiconductor foil can be accomplished by adding doping metals to the molten metallic bath. For example, In, Ga, or Al may either be the sole, or a major, constituent of the molten metallic bath, or they may be added to a molten metallic bath of other metal(s) to obtain a p-type doped Si foil. Small amounts of boron (B) may be added to the molten metallic bath to obtain p-doped Si foils. Similarly, antimony (Sb), Arsenic (As), and/or phosphorus (P) may be added to the molten metallic bath to obtain n-type doped Si and/or Ge foils. Such doping can provide either a p-type layer and/or an n-type layer required for a solar cell p-n junction. Furthermore, due to the foil growth along the direction of its thickness over a temperature range (from about $T_2$ to about $T_1$), a doping gradient may be formed across the thickness of the foil. Such a doping gradient along the thickness may be used to create a beneficial electric field toward the p-n junction, thereby enhancing solar cell conversion efficiency.

Although the techniques disclosed herein describe growing Si at a top surface of molten indium and/or tin, they should be regarded only as examples, and not as limiting the scope of the invention. Similar apparatus and techniques may be utilized for growing, for example and without a limitation, other semiconductors foils such as Ge, Si—Ge, GaAs, InP, InSb, GaP, AlGaAs, AlGaP, and mixtures thereof, or using one or more of the metals In, Sn, Ga, Al, Zn, and Pb as the molten metallic bath (or medium). Si has a density (or specific gravity) of 2.33 g/cm$^3$, In has a density of 7.31 g/cm$^3$, Sn has a density of 7.30 g/cm$^3$, and Ga has a density of 5.91 g/cm$^3$. As such, these metals are suitable to be used alone, or in combination with one or more other metals from this group (In, Sn, and Ga), as the molten metallic bath for growing Si and/or Ge ribbons (or foils, or films, or ribbons, or panels, or sheets) in accordance with one or more embodiments of the invention. Al has a density of only 2.70 g/cm$^3$, and may not be suitable to be used alone as the molten metallic bath (or medium). However, it can be combined with one or more metals from the above group, particularly as a p-type dopant. It is also noted that Ge has a density of 5.32 g/cm$^3$, which is closer to the density of Ga. As such, growing Ge ribbons may be more limited than growing Si or Si—Ge ribbons. Furthermore, Ge ribbons may be less attractive than Si ribbons, because Ge has fewer applications than Si in semiconductor devices such as solar cells and display panels. For these reasons, the embodiments and examples described herein are mainly for growing Si ribbons or panels, but the invention is not limited to Si applications, and the invention also includes other semiconductors ribbons or panels, such as Ge, Si—Ge, GaAs, InP, InSb, GaP, AlGaAs, AlGaP, or mixtures thereof. Some semiconductor applications call for Si—Ge alloys, or multilayer combinations, such as Si/Ge, GaAs/Si, GaAs/Ge. In one embodiment of the invention, a duplex (or a triplex) of combined Si/Ge, GaAs/Si, or GaAs/Ge layers can provide improved solar cell conversion efficiency where one layer (Ge) absorbs radiation in the IR spectrum, and another layer (such as Si or GaAs) absorbs radiation in the visible and ultraviolet spectra of solar light.

FIG. 1A is a schematic side view cross-section of apparatus 10 that is fabricated in accordance with one embodiment of the invention. Semiconductor source material 12, in the form of granules, lumps, slugs, shots, chunks, powder, or wafers, is placed in a molten metallic bath 16. In one embodiment, molten metallic bath 16 comprises In and/or Sn, and the floating foils comprise Si and/or Ge. Although the examples below refer to Si and/or Ge source material 12, and molten In and/or Sn bath 16, it should be understood that the invention includes other semiconductor materials, and that molten metallic bath 16 may comprise one or more metals chosen from a group consisting of In, Sn, Ga, Al, Zn, and Pb. Also, Si and/or Ge, or other semiconductor source material 12 may be of high purity, or it may be relatively impure (such as "metallurgical grade silicon"). In the latter case, purification of the grown semiconductor ribbon or panel (relative to the starting semiconductor source material 12) may be obtained due to the extremely small segregation coefficients of most impurities. An impurity segregation coefficient is defined here as a ratio between the concentration of that impurity in the formed floating solid semiconductor foil (or film, or ribbon, or panel, or sheet) and its concentration in the molten metallic bath. For example, the segregation coefficient of a particular impurity is the ratio between the concentration of that impurity in ribbon (28) and the concentration of that impurity in the molten metallic bath (17) in FIG. 1A.

Figure 1B:
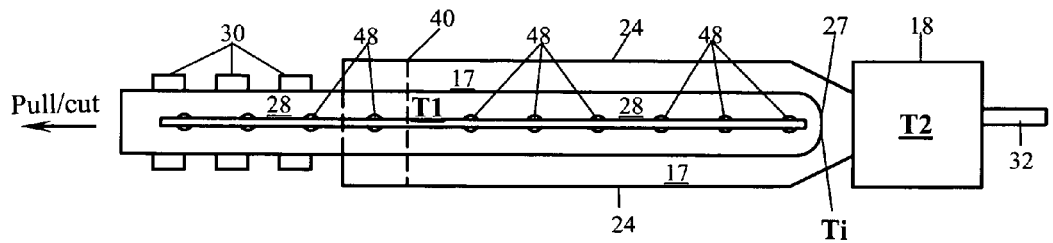
FIG. 1B shows a schematic top view of the apparatus of FIG. 1A.

In one embodiment of the invention, molten metallic bath 16 is contained in a holding tank 18. The molten metallic bath 16 and excess semiconductor source material 12 (such as chunks, granules, lumps, slugs, shots, powder, or wafers) in tank 18 are maintained at an elevated temperature $T_2$, thus attaining a saturated, or a highly concentrated solution 16. Outlet opening 20 at the bottom of tank 18 allows a flow of the molten metallic bath out of tank 18. The flow of the molten metallic bath in the apparatus is indicated by arrows. Strainer 22 (or a screen, or a sieve) is provided in outlet opening 20 to filter out solid semiconductor source particles, and prevent their out-flow from holding tank 18. Saturated (or highly concentrated) molten metallic bath 16 flows through outlet opening 20 into tilted flow-channel 24. Tilted channel 24 has a fan-like shape which is shown in FIG. 1B (FIG. 1B is a schematic top view of apparatus 10). Down-stream end zone 40 of tilted flow channel 24 is maintained at temperature $T_1$. Temperature $T_2$ of molten metallic bath 16 in tank 18 is significantly higher than temperature $T_1$ of the flowing molten bath 17 located at the end zone 40 of channel 24:

$$T_2 >> T_1; \Delta T = T_2 - T_1 \tag{1}$$

For example, while $T_2$ may be in a range of about 700-1,400° C. (for Si), and preferably in a range of about 800-1,000° C. (for Si), $T_1$ may be in a range of about 300-900° C. (for Si), and preferably in a range of about 400-600° C. (for Si). AT may be larger than about 100° C., preferably larger than about 200° C., and more preferably larger than about 300° C. Molten bath 17 in flow channel 24 is drained through drain opening 26 located at the bottom of down-stream end zone 40 of channel 24. Drain opening 26 may have a funnel shape. Floating semiconductor ribbon 28 is pulled over rollers 30 outside end zone 40 of flow channel 24. Drained molten metallic bath 17 is circulated back by pump 34 into holding tank 18 through a return pipe 32. Return pipe 32 is maintained at a temperature $T_3$, which preferably is higher than $T_1$ to avoid precipitation of left-over dissolved semiconductor therein. $T_3$ need not be a single temperature. Rather, it may also represent a temperature range above $T_1$. Temperatures $T_1$, $T_2$, and $T_3$ at their appropriate locations are provided by separate heaters (not shown). An inert or reducing atmosphere, such as argon, hydrogen, helium, nitrogen, or a mixture of two or more of these gases, is maintained above holding tank 18, flow channel 24, and rollers 30 to prevent oxidation of the floating solid semiconductor and the molten metallic bath materials. Preferably, construction materials of holding tank 18, flow channel 24, and return pipe 32 are compatible with the molten metallic bath and the semiconductor, at the respective temperatures, to avoid contamination of the molten metallic bath and the grown semiconductor ribbon. Possible construction materials may include quartz, densified graphite (including graphite with CVD-coated carbon), pyrolitic (or glassy) carbon, tungsten, molybdenum, tantalum, titanium, silicon, silicon carbide, sapphire, and the like. Preferably, rollers 30 would also be compatible with the pulled semiconductor ribbon (i.e., rollers 30 would preferably produce minimal or no deleterious contamination of semiconductor ribbon 28, and introduce minimal or no mechanical defects into ribbon 28). Rollers 30 may also be constructed from materials such as quartz, densified graphite (including graphite with CVD-coated carbon), pyrolitic (or glassy) carbon, Si, SiC, sapphire, tungsten, molybdenum, tantalum, titanium, and the like. The various temperature zones and gradients are maintained by separate heaters (not shown) and cooling gas blowers or nozzles 48. The heaters can be of designs and constructions well-known in the art of furnaces and heaters, such as electrical resistive furnaces or RF inductor heaters. Shower heads or nozzles 48 of appropriate shapes and distribution may be used in the cooling gas blowers.

The solubility of the semiconductor in the molten metallic bath is non-linear with temperature. Higher $T_2$ increases significantly the solubility of the dissolved semiconductor in a given volume of the molten metallic bath. For example, according to a Si—Sn phase diagram on pg. 334 of Metals Handbook, 8th Edition, Vol. 8, American Society for Metals, 1973, Si solubility in molten Sn at 1,300° C. is about 0.85 wt %. It drops to about 0.4 wt % at 1,200° C., and then to about 0.16 wt % at 1,100° C. It then rapidly drops to about 0.06 wt % at 1,000° C., and to about 0.02 wt % at 900° C. As a result, higher $T_2$ facilitates faster growth and transport of the Si ribbon. However, a higher $T_2$ results in a higher level of the metallic bath impurity inclusion (or contamination) of the solid Si ribbon. Similarly, lower $T_1$ ensures more complete separation of the dissolved Si from the molten metallic solvent, and less incorporation of In and/or Sn into the bottom of the Si ribbon. It is, therefore, desirable to optimize $\Delta T$. For economical (energy savings) and materials compatibility considerations, it is desirable to operate at as low temperatures as feasible. $T_1$ is limited from below by the melting point (m.p.) of the metallic bath (the melting point of indium is 156° C., and the melting point of tin is 232° C.). To maintain the indium and/or tin in a molten state, $T_1$ may be set higher than the melting point of In or Sn. Also, a very low $T_1$ produces high viscosity of the melt near down-stream end zone 40, and may require a very long flow channel 24. These conditions will tend to slow down the feasible pulling rate of the solid ribbon. A reasonable compromise for $T_1$ is in a range from about 400 to about 800° C. $T_2$ may be optimized when other parameters are known (or estimated). For example, using solubility data from the discussed above Si—Sn phase diagram (Metals Handbook), if the required thickness of Si ribbon 28 is about 100 μm (0.01 cm), $T_2$ of about 1,000° C. is calculated, assuming a 5 cm depth of molten tin 17 in flow channel 24. The estimated $T_2$ is calculated as follows:

Weight of a molten tin column of 5 cm deep and 1 cm² area: $h_{Sn}*\rho_{Sn}=5*7.30=36.5$ g Weight of required 0.01 cm thick Si sheet and 1 cm² area: $h_{Si}*\rho_{Si}=0.01*2.33=0.0233$ g Weight percentage of dissolved Si in molten Sn: 100*0.0233/36.5=0.06 wt %

$T_2$ at which Si solubility in molten Sn is 0.06 wt % (from phase-diagram): $T_2=1,000°$ C.

Here $h_{Sn}$ is the depth of molten tin 17; $h_{Si}$ is the required thickness of Si ribbon 28; $\rho_{Sn}$ is tin density (or specific gravity); and $\rho_{Si}$ is silicon density (or specific gravity).

Solubility data of Si in a molten In bath is provided in an In—Si phase diagram of R. W. Olesinski et al., in Binary Alloy Phase Diagrams, II Ed., edited by T. B. Massalski, Vol. 3, 1990, pp. 2292-2293. Similar to the calculation above, the information in the In—Si phase diagram can be used to estimate the required saturation temperature $T_2$ of Si in a molten In bath for a specific thickness of the Si ribbon and a given channel depth. For example, assuming a required thickness of 100 μm (0.01 cm) of Si ribbon (or foil, or film, or sheet) 28, $T_2$ of about 770° C. is calculated, assuming a 5 cm depth of molten indium 17 in flow channel 24. The estimated $T_2$ is calculated as follows:

Weight of a molten indium column of 5 cm deep and 1 cm² area: $h_{In}*\rho_{In}=5*7.31=36.55$ g Weight of required of 0.01 cm thick Si sheet and 1 cm² area: $h_{Si}*\rho_{Si}=0.01*2.33=0.0233$ g Weight percentage of dissolved Si in molten Sn: 100*0.0233/36.55=0.06 wt %

$T_2$ at which Si solubility in molten In is 0.06 wt % (from phase-diagram): $T_2=770°$ C.

Here $h_{In}$ is the depth of molten indium in channel 17, and $\rho_{In}$ is indium density.

It should be noted that the above calculations assume complete separation (or precipitation) of the entire content of the dissolved Si from the entire depth of molten metallic bath 17 in flow channel 24. In reality, however, due to non-equilibrium ribbon growth, some Si may be left dissolved in molten bath solvent 17, so that the actual ribbon thickness is less than the calculated value. Nevertheless, such calculations are useful and convenient guidelines for the design of the apparatus and its operation. For example, one can readily estimate that a $T_2$ of about 1,075° C. would double the Si ribbon 28 thickness grown from molten Sn, since the Si solubility is increased to about 0.12 wt % (which is twice the solubility at 1,000° C.). Doubling the depth of molten bath 17 in flow channel 24 (from 5 cm to 10 cm) would also result in about twice the thickness (~200 μm) of Si ribbon 28. Similarly, reducing $T_2$ to ~900° C. in molten Sn, would result in a Si foil thickness of only about 30 μm. For solar cell applications, it is desirable to obtain a Si ribbon thickness in a range of about 10-200 μm, and preferably in a range from about 30 to about 150 μm. The thinner the ribbon is, the lower is the Si and/or Ge material cost. However, sufficient ribbon or foil thickness is required for device performance, and for mechanical strength.

It is noted that for a given saturation temperature $T_2$, the solubility of Si in molten In is significantly higher than in molten Sn. For example, while Si solubility in molten In at 1,000° C. is about 0.5 wt %, it is only about 0.06 wt % in molten Sn at the same temperature. In one embodiment of the invention, mixing a molten bath of the two metals, In and Sn, at a predetermined chosen ratio, may be used to obtain certain desirable features of the molten bath. The molten In—Sn mixture bath will have an intermediate Si solubility (i.e., a solubility between the solubilities in the individual molten metals), thereby facilitating optimization of $T_2$ and the flow channel depth. For example, the high solubility of Si in molten In at (relatively) low $T_2$ may have several drawbacks. The obtained Si ribbon may be too thick, and/or the crystallization temperature might be too low, thereby adversely affecting the grain size and quality of the Si ribbon. Also, the required flow channel depth might be too shallow when using In alone, thereby impeding flow along the channel. Adding Sn to the molten In bath, at a predetermined ratio, would lower the Si solubility in the melt, thereby facilitating higher $T_2$ and/or a deeper channel. In addition, adding Sn to an In melt would reduce the molten bath cost, since Sn is less expensive than In.

In addition to the parameters discussed above, tilt angle α between flow channel 24 and the horizon, and the length l of flow channel 24, are further parameters. Increasing tilt angle α increases the flow rate of molten bath 17 in channel 24, thereby increasing the pulling rate (and production) of semiconductor ribbon 28. However, the rate of semiconductor ribbon 28 production needs also to be optimized with regard to crystalline grain size, quality (minimum defects and/or dislocations), and purity of the semiconductor ribbon. The faster the pulling rate of ribbon 28, the poorer its quality, purity, and grain size. Similarly, a too short length l of flow channel 24 may also lead to poor quality and purity of the semiconductor ribbon. A longer flow channel 24, and a shallower tilt angle α, facilitate larger grain size (crystalline quality) and higher purity of the semiconductor ribbon, and vice versa.

Due to the fan-like shape of flow channel 24 (see FIG. 1B), floating semiconductor ribbon 28 does not contact the walls of flow channel 24, thereby avoiding friction, contamination, and mechanical damage to Si ribbon 28. In an alternative embodiment, the width of semiconductor ribbon 28 may extend to the sidewalls of flow channel 24. In particular, flow channel 24 is preferably constructed from a non-wetting material (such as glassy carbon, CVD-carbon coated densified graphite, or quartz), thereby minimizing adhesion and/or friction between the stationary sidewalls and the moving semiconductor ribbon. Using a non-wetting construction material for flow channel 24 is also useful where the ribbon is narrower than the width of channel 24, to avoid (or minimize) sporadic nucleation of the ribbon material on the bottom and sidewalls of channel 24.

Semiconductor ribbon 28 does not form in channel 24 close to outlet 20 because it is still completely dissolved (by supersaturation) in the molten bath there. It takes a certain distance (point 27) for the molten bath solution to flow, before it cools sufficiently to initiate semiconductor separation (or precipitation). The temperature difference, $\delta T$, between $T_2$ and the initial separation out (or precipitation) temperature $T_i$ at point 27, is referred to as "supercooling": $\delta T = T_2 - T_i$. For example, Inventor's experiments with dissolved Si in molten In baths indicate that the supercooling $\delta T$ (for that system) is about 3-20° C. In one embodiment of the invention, cooling gas is blown through nozzles 48 at the top surface of ribbon 28 to establish a large vertical temperature gradient. The large vertical temperature gradient accelerates and enhances preferential nucleation and crystallization of the semiconductor ribbon on the top surface of the molten metallic bath. The cooling gas may be blown through one or more shower heads or nozzles 48 along a direction substantially normal to the top surfaces of molten bath 17 and ribbon 28. In an alternative embodiment, the cooling gas is blown at (and along) the top surfaces of molten bath 17 and ribbon 28, in a direction substantially parallel to the flow of molten bath 17 in flow channel 24.

Floating semiconductor ribbon 28 exits from flow channel 24 at down-stream end 40. On its exit, semiconductor ribbon 28 is supported by rollers 30 to maintain its flat shape. If necessary, it is also pulled (over rollers 30) and cut into panels (not shown) of appropriate length and width. The width of semiconductor ribbon 28 is largely determined from a balance between the pull rate (and/or gravity), rate of feed of saturated molten bath solution 16 from holding tank 18, and the tilt slope (angle α) of flow chamber 24. Thus, for example, increasing slope angle α, and/or the pull rate, will narrow the width of semiconductor ribbon 28, while increasing the rate of feed will widen it, and vice versa. The width of outlet 20 is another important factor determining the final width of semiconductor ribbon 28. A wider outlet 20 will produce a wider ribbon 28. In an alternative embodiment, the width of semiconductor ribbon 28 may be the same as the width of flow channel 24.

Figure 2:
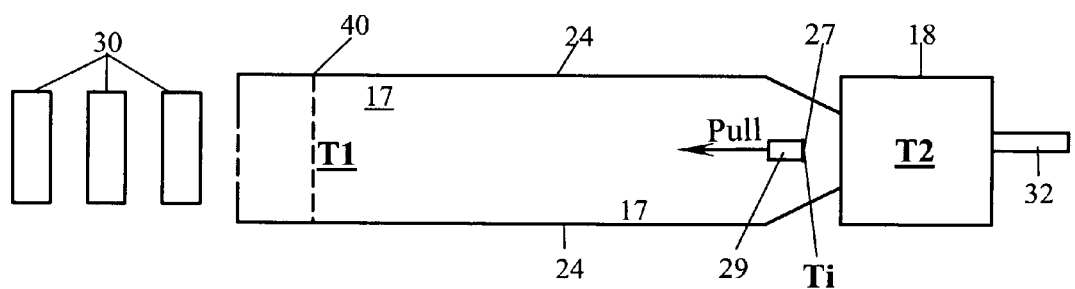
FIG. 2 shows a schematic top view of the apparatus of FIG. 1A, at an early stage of growing and pulling a semiconductor ribbon, in accordance with one or more embodiments of the invention.

FIG. 2 shows another embodiment of the invention. FIG. 2 is a schematic top view of the apparatus shown in FIG. 1B, but prior to the initial growth of the ribbon. Several elements have been omitted in FIG. 2 to simplify the explanation. Piece 29 of solid semiconductor, such as a piece cut from a single-crystal semiconductor wafer, is floated over molten metallic bath 17, close to (or at) point 27, to seed or nucleate the growth of the semiconductor ribbon 28. In one embodiment, the width of semiconductor piece 29 is much smaller than the width of ribbon 28. Thus, except for an initial nucleation and growth on piece 29, substantially the entire ribbon 28 grows at the top surface of molten bath 17. In another embodiment, the semiconductor piece 29 may have a width which is substantially the same as the width of channel 24. Semiconductor piece 29 may be later used as a "hook" to pull off ribbon 28 from over end 40 of flow channel 24. Use of such a piece may be advantageously used as a seed to enhance crystalline orientation, and/or grain size, of the growing floating ribbon. In one embodiment, grabbing and pulling semiconductor piece 29, and/or ribbon 28, may be accomplished by temporarily attaching a vacuum clamp or chuck (not shown) to the top surface of piece 29 and/or ribbon 28, and pulling along the direction of rollers 30. In another embodiment, floating ribbon 28 in the vicinity of down-stream end 40 may be subjected, at least temporarily, to a sub-atmospheric pressure (or vacuum), to ease the separation of floating ribbon 28 from the top of molten bath 17.

According to another embodiment, the floating semiconductor ribbon can be purified by passing it under (and/or above) one or more heater rods or RF inductor coils (not shown) disposed across the width of the ribbon. The ribbon (and/or the heater rod(s) or RF coils) is moved in a direction along the ribbon length. The heater rod(s) or RF coils may be placed in apparatus 10 described above, or in an extension line, after the ribbon has left the molten metallic bath. The temperature in the ribbon zone passing directly under (and/or above) a heater rod (or RF coil) can be raised to about the melting point of the semiconductor, or slightly above it. This method may thus provide zone refining of the ribbon, whereby contaminants are pushed toward the back of the ribbon. The back-end of the ribbon is than discarded, or separately purified. Alternatively, the ribbon may be first cut into segments, and each segment is subjected to the above zone refining. In this case, the back-end of each segment is more contaminated than the rest of the segment, and the back-ends of the segments can be cut off and discarded, or they can be subjected to further purification and recycling.

Figure 3:
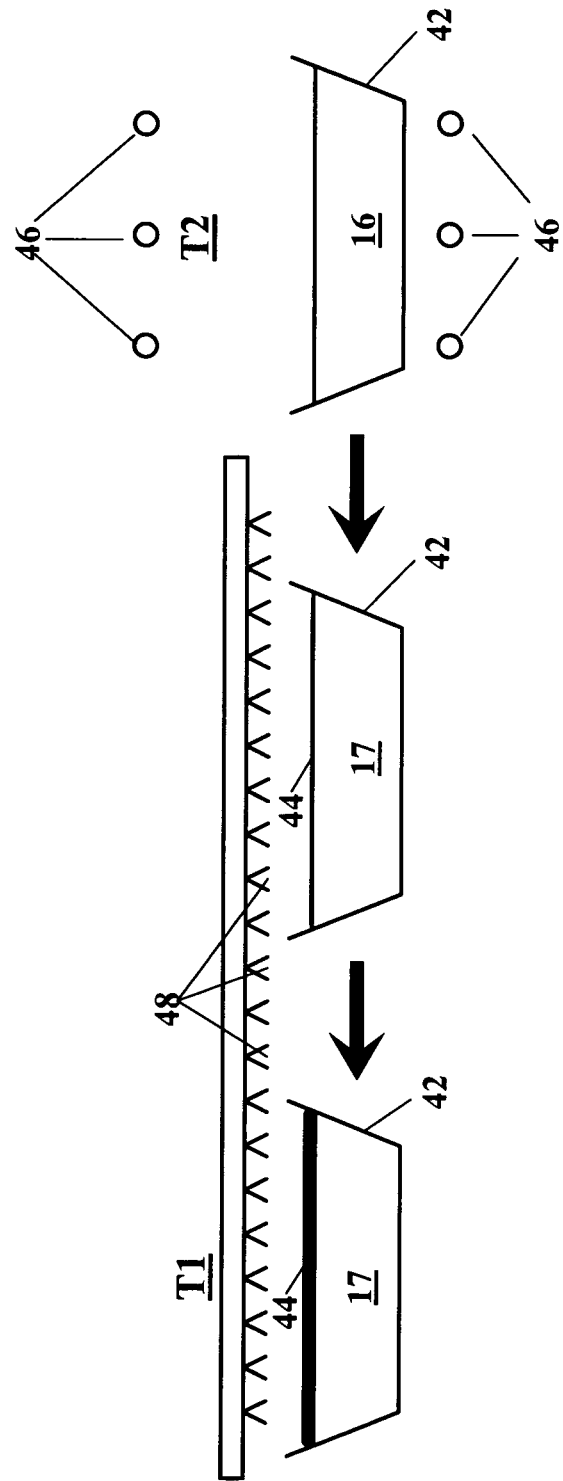
FIG. 3 shows a schematic side view of apparatus constructed in accordance with one or more alternative embodiments of the invention.

FIG. 3 illustrates alternative embodiments of the invention. Semiconductor source material (not shown) is first dissolved (to saturation or to a highly concentrated solution) in molten metallic bath 16 inside one or more trays 42 located at a hot zone temperature $T_2$, and the excess source material is then removed from the one or more trays 42. In an alternative embodiment, a predetermined amount of semiconductor source material is placed in trays 42, and the trays are filled with molten metallic bath, either before, or after, the placement of the source material in the trays. In these embodiments, the amounts of source material and molten metallic bath are calculated and measured to avoid excess solid source material in the trays after its dissolution in the melt. Alternatively, semiconductor source material is dissolved in a molten metallic bath inside a holding tank, such as tank 18 in FIG. 1A, and the saturated or highly concentrated solution is poured into one or more trays 42. Although FIG. 3 shows one tray 42 (for simplifying the drawing), and the disclosure relates to a single tray 42, it should be understood that embodiments of the present invention also include multiple trays 42. In one alternative embodiment, tray 42 is filled with a saturated (or a highly concentrated) solution of molten metallic bath 16 from a holding tank at temperature $T_2$. Tray 42 is then moved from hot zone $T_2$ towards a colder temperature zone $T_1$ along the direction of the bold arrows. In an alternative embodiment, heating elements 46 are moved away from tray 42. The cooling of the solution causes dissolved semiconductor to separate out of solution and, due to the lower density (or specific gravity) of the semiconductor than that of the molten metallic bath, floats to the top surface of the molten metallic bath. The floating semiconductor then grows as floating panels 44 (or foils, or films, or ribbons, or sheets) on top of the molten metallic bath. Cooling of the solution can be enhanced by injecting cooling gas through shower heads or nozzles 48, impinging along a direction substantially normal to the top surface of the molten metallic bath (and the top surface of the floating panel), thereby creating a strong vertical thermal gradient across the thickness of the floating panel. Strong vertical thermal gradient improves nucleation and growth, and the quality, of large grains (or substantially single-crystalline) semiconductor panels. The floating semiconductor panel is then pulled out of the tray at $T_1$. More trays can be used to increase throughput, where the process is repeated for each tray, or the same tray can be returned to the hot zone $T_2$ to repeat the process. The process can be programmed to allow sufficient time (for example, by slowing the tray movement or stopping it for a prescribed duration) in the hot zone $T_2$ to ensure sufficient dissolution (to saturation or to a highly concentrated solution) of the semiconductor source material. Similarly, the velocity of the tray(s) away from the hot zone can be programmed and optimized for best results. Cooling inert and/or reducing gas may be blown through nozzles 48 at the top surface of the molten metallic bath and/or the floating semiconductor Ge panel to produce a vertical thermal gradient at the top surface of the molten metallic bath. The vertical thermal gradient facilitates preferential nucleation and growth of the semiconductor panels at the top surface of the molten bath. Preferably the vertical thermal gradient may be larger than about 100° C./cm. In another embodiment (not shown), the cooling gas may also be blown along a direction substantially parallel to the top surface of the molten metallic bath. In yet another embodiment, the cooling gas may be blown in both directions.

In other embodiments of the invention, semiconductor source material is placed together with one or more metals chosen from a group consisting of In, Sn, Ga, Al, Zn, and Pb, inside a tray or a container enclosed inside an inert (or reducing) atmosphere. A moving hot zone $T_2$, produced, for example, by moving one or more heater rods or RF induction coils 46, causes the dissolution of the semiconductor source material in the molten metallic bath at $T_2$. As the hot zone moves away from (and along a length of) the tray, the molten metallic bath cools down, and dissolved semiconductor separates out and floats to the top. The floating semiconductor panel is then pulled or raised out of the container. The process is then repeated. More semiconductor source material is added to the molten metallic bath, and the hot zone is moved again along a length of the tray to dissolve the semiconductor source material. The rest of the cycle is then repeated. The process can be programmed to allow the hot zone sufficient time (for example, by slowing its motion or stopping it for a prescribed duration) to complete the dissolution of the semiconductor source material at $T_2$. Similarly, the velocity of the hot zone away from the tray may be programmed and optimized for best results. Again, cooling gas may be blown at the top surface of the molten bath and/or the floating semiconductor panel in order to produce a vertical thermal gradient. The vertical thermal gradient facilitates preferential nucleation and growth of the semiconductor panels at the top surface of the molten bath. The cooling gas may be blown through one or more shower heads or nozzles 48 along a direction substantially normal to the surface of the molten bath, and/or along a direction substantially parallel to the surface of the molten metallic bath.

Figure 4:
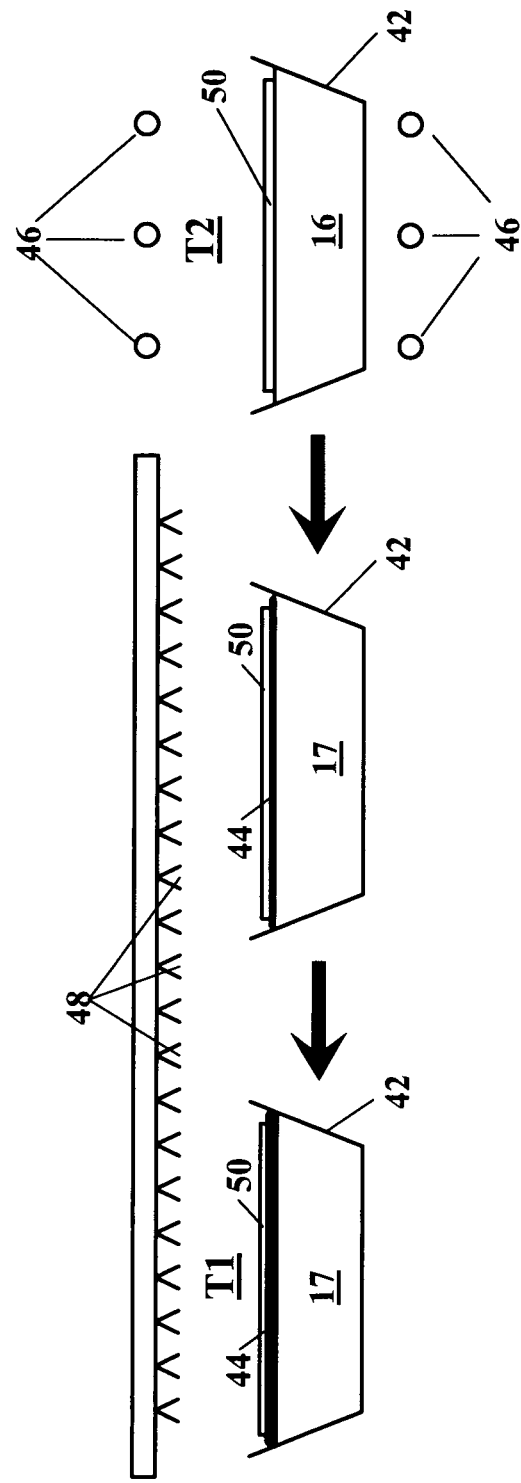
FIG. 4 shows a schematic side view of apparatus constructed in accordance with one or more embodiments of the invention.

FIG. 4 illustrates other embodiments of the invention. A flat plate (or sheet) 50 floats on top of saturated (or highly concentrated solution) molten metallic bath 16 at $T_2$, prior to commencing cooling of the molten metallic bath. Flat plate 50 floats on the top surface of molten metallic bath 16 due to its lower density (or specific gravity) than that of the molten metallic bath. Preferably, flat plate 50 is made of a compatible and transparent material, such as quartz or sapphire. Floating plate (or sheet) 50 facilitates uniform (or adiabatic) vertical thermal gradient, produced by blowing a cooling gas at plate 50. In embodiments utilizing semiconductor (such as Si and/or Ge) powder (see FIG. 5 below), the melting heat pulses may be applied through the transparent sapphire or quartz plate (or sheet) prior to commencing cooling of the molten metallic bath. Plate 50 improves temperature uniformity across the top surface of molten metallic bath 16, and mitigates temperature fluctuations across this surface. Uniform nucleation and growth of floating semiconductor foil 44 are thus enhanced by using floating plate 50. Due to the transparency of plate 50, cooling of the top surface of molten metallic bath (under plate 50) by heat radiation is not impaired. Furthermore, injecting or blowing cooling gas through shower heads or nozzles 48, impinging on plate 50 along a direction substantially normal to its top surface, creates a uniform strong vertical thermal gradient across plate 50 and across the top surface of the molten metallic bath. A strong uniform thermal gradient at the top surface of the molten metallic bath improves uniform nucleation and growth, and the quality, of large grains (or substantially single-crystalline) semiconductor panels. Although the use of floating plate 50 was described in FIG. 4 for growing floating semiconductor panels 44, other embodiments of the invention include similar use of a floating plate or sheet (not shown) on top of a molten metallic bath, in the growth of floating semiconductor ribbons (such as ribbon 28 in FIGS. 1A-1B).

Figure 5:
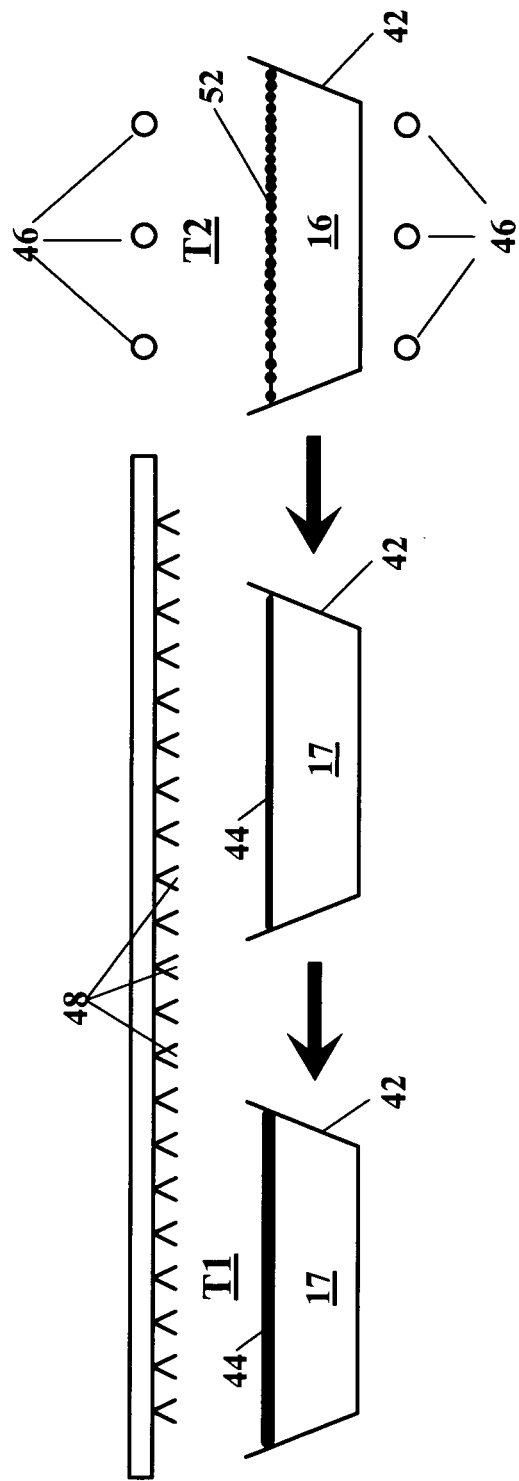
FIG. 5 shows a schematic side view of apparatus constructed in accordance with one or more embodiments of the invention;.

FIG. 5 illustrates other embodiments of the invention. Semiconductor powder (or small pieces, or granules, or chunks) 52 is placed on top of saturated (or highly concentrated) molten metallic bath 16 at $T_2$, prior to cooling and initiation of the semiconductor nucleation and growth. Due to its lower density (than that of the molten metallic bath), semiconductor powder 52 floats on top of molten metallic bath 16. Prior to commencing cooling of tray 42, one or more melting heat pulses are applied to semiconductor powder 52 in order to melt it and spread the molten semiconductor as a continuous (or substantially continuous) molten semiconductor layer across a top surface of molten metallic bath 16. The molten semiconductor layer then solidifies as a continuous (or substantially continuous) floating thin film semiconductor (not shown) on the top surface of molten metallic bath 16. The solidified thin film semiconductor may later serve as a seed for further growth (thickening) of floating semiconductor panel 44. Next, tray 42 is cooled to lower temperature $T_1$. The cooling of molten metallic bath 17 causes dissolved semiconductor to separate out from solution, and grow at the bottom of the floating thin film semiconductor. Thus, the continuous floating thin film semiconductor enhances the growth, and quality, of large grains (or substantially single-crystalline) semiconductor panels, by substantially reducing, or eliminating, sporadic nucleation of semiconductor panel 44.

In another embodiment, sufficient semiconductor powder (or granules, or slugs, or chunks) is placed over the saturated molten metallic bath to produce (after melting by one or more heat pulses) a solidified semiconductor panel (or ribbon) with a predetermined thickness. In this embodiment, the semiconductor panel (or ribbon) may be pulled off from the molten metallic bath surface without cooling the latter. Also in this embodiment, the molten metallic bath may be kept at a relatively low temperature (for example, between 300-700° C.).

Other embodiments of the present invention include the combination of semiconductor powder 52 and a floating plate (such as plate 50 in FIG. 4), and the use of such combinations for growing semiconductor ribbons (such as ribbon 28 in FIGS. 1A-1B). The one or more heat pulses may be applied by a laser, infrared, or ultraviolet radiation. The heating radiation can be transmitted through the transparent plate 50 to heat semiconductor powder 52. The one or more heating pulses should temporarily increase the temperature of semiconductor powder 52 to exceed its melting point. For example, the heating of Si powder should exceed its melting point (at 1,414° C.).

The floating semiconductor panels can be lifted or raised upward using, for example and without limitation, a flat horizontal quartz plate strainer, or a sieve (not shown), having small holes (of about 1-3 mm diameter). The flat horizontal plate strainer may be connected (or welded) to one or more vertical quartz rods, located at the peripheries of the horizontal plate strainer. The flat plate strainer and the vertical rods may also be constructed from other materials compatible with the molten metallic bath and the semiconductor panels. In operation, the horizontal plate strainer is dipped below the top surface of the molten metallic bath prior to forming the floating semiconductor panel. Following the formation of the panel, the horizontal plate strainer is pulled upward by the vertical rods to above the top surface of the molten metallic bath, thereby separating the semiconductor panel from the molten metallic bath. Entrapped molten liquid between the panel and the plate strainer can then drip through the holes in the plate strainer back into the tray.

In other embodiments (not shown), molten semiconductor (at a temperature $T_2$ above the melting point of the semiconductor (for example, >1,414° C. for Si), is poured over a saturated molten metallic bath, and a floating ribbon of solidified semiconductor is pulled along a cooled channel filled with the molten metallic bath. In accordance with this method, the molten semiconductor solidifies on a molten bath surface, thereby eliminating interfacial stress and associated deleterious defects (such as dislocations, voids, and small grains). As a result, large grain polycrystalline, or a single crystalline, Si ribbon of high quality may be grown at high pulling rate and throughput. Further, in accordance with this method, the solidified ribbon is pulled off from the top surface of the molten metallic bath, at a lower temperature $T_1$ (where $T_2-T_1>100°$ C.) without flowing the molten metallic bath along a (tilted) channel, thereby avoiding the need to circulate the molten metallic bath back to the hotter temperature $T_2$.

In the above embodiments, the molten metallic bath provides a flat, smooth, and substantially stress-free liquid-solid interface, thereby facilitating production of a smooth and flat surface, and high quality large grain polycrystalline (or single-crystalline) semiconductor ribbons (or foils, or films, or panels, or sheets).

EXAMPLE 1

300 g of 99.9995% pure In ingots (6 ingots of 50 g each) were placed in a quartz crucible. The crucible was positioned vertically on a quartz pedestal inside a 3" diameter quartz tube. The quartz tube and its contents were placed inside a vertical 3" tube furnace. The 3" quartz tube had a bottom flange and a top flange, providing vacuum tight sealing of the 3" quartz tube. The flanges were equipped with chilling refrigerant recirculating through a chiller. In addition, the bottom flange was equipped with vacuum and gas outlets, and a central 0.5" Swagelok fitting for an adjustable height quartz pedestal. The top flange was equipped with a gas inlet, an illumination window, a viewing port window, and two 0.25" Swagelok fittings for am adjustable height 0.25" quartz rod and/or a 0.25" quartz tubing. A gas mixture of pure Ar containing 3.9% $H_2$ (by volume) was used to flush the 3" quartz tube chamber. This was done by first evacuating the chamber, followed by introduction of the gas mixture, and repeating this cycle 3 times at room temperature. The chamber temperature was then raised to ~300° C., and one vacuum/flush cycle was applied. This was followed by another vacuum/flush cycle at ~500° C. In this experiment, the gas mixture was introduced through an adjustable height 0.25" quartz tube ("bubbler"). The bubbler was introduced into the molten In at ~500° C., and the flow rate was adjusted to 50 ml/min. After about one hour of bubbling, the bubbler was raised above the melt. The chamber temperature was then raised to 852° C. (melt temperature of 850.8° C.), and a Si-source piece (attached to a 0.25" quartz rod) was dipped into the melt for 45 minutes. After 45 minutes, the left-over Si-source piece was raised, and a programmed cooling of the melt was initiated. The cooling rate was 0.7° C./min from 850° C. to 820° C.; 2.0° C./min from 820° C. to 770° C.; and 4.0° C./min from 770° C. to 500° C. The furnace was then turned off and cooled at about 7.0° C./min to room temperature.

The chamber was opened at room temperature and the following observations were made: (a) The Si-source piece lost 0.2720 g from it original weight due to dissolution into the melt. According to the In—Si phase diagram, the expected weight loss was 0.39 g at 850° C. Thus, the dissolution was only about 70% of the expected value. (b) A continuous film of ~3 cm diameter, in the center of the crucible, was found on top of the frozen In slug. The film was inspected by scanning electron microscope (SEM), and was found to consist of high purity Si crystals (or grains) with typical grain size of several hundreds micrometers. (c) Several Si crystals were removed from the frozen In slug, and were analyzed by secondary ion mass spectroscopy (SIMS) for In impurity.

One grain (flat Si single-crystal) had an In impurity level as low as ~14 ppb, and another one had an In impurity of 0.1 ppm. The In impurity level is suitable for use of the floating Si foil for solar cell applications. Solar cell applications typically require impurity levels below about 1.0 ppm. These results are unexpected, since available data of Al solubility in solid Si at 850° C. is ~260 ppm, and Sn solubility in solid Si at 850° C. is ~700 ppm. Based on the solubilities of Al and Sn in solid Si at 850° C., one would expect the In solubility (in the floating Si at 850° C.) to be in the same range; i.e., several hundred ppm.

EXAMPLE 2

Similar equipment and procedures as described in Example 1 above, but pure $H_2$ gas was used instead of bubbling an Ar/$H_2$ (3.9%) gas mixture. Also, the bubbler was placed at about 2 cm above a floating quartz disk, to provide a uniform vertical thermal gradient. In addition, the dissolution temperature $T_2$ was ~1,000° C., and the programmed cooling was 0.7° C./min from 980° C. to 800° C.; 1.0° C./min from 800° C. to 700° C.; 1.5° C./min from 700° C. to 600° C.; 2.0° C./min from 600° C. to 500° C. The floating film was raised by a quartz lifter (a 55 mm quartz strainer or sieve attached to a 0.25" quartz rod) at 500° C., and the furnace was then turned off. Hexagonal, triagonal, and trapezoidal flat Si single crystals with thickness of ~75 μm were observed. The obtained Si-foil was multicrystalline with grains (single-crystals) of several millimeters size. The flat Si crystals had a strong <111>preferred orientation. SIMS analyses of several flat Si crystals indicated that oxygen content was about 1.8 ppm, and carbon content was below detection level (50 ppb). Trace elemental analysis was done by a Laser Ablation Inductive Coupling Plasma Mass Spectroscopy (LA-ICPMS) technique. The analysis indicated that all metallic impurities were below 0.1-1.0 ppm. This analysis indicates that the Si material is suitable for use in solar cell applications, because solar cell applications typically require impurity levels below about 1.0 ppm.

Those skilled in the art will recognize that the foregoing description and examples have been presented for the sake of illustration and description only. As such, they are not intended to be exclusive or to limit the invention to the precise form disclosed.

We claim:

1. A method for producing a semiconductor foil, said method comprising:
   dissolving a semiconductor source material in a molten metallic bath at temperature $T_2$ to form a molten solution, wherein a density of the solid semiconductor is lower than a density of the molten metallic bath by at least 0.5 g/cm³;
   cooling at least a portion of the molten solution to a lower temperature $T_1$, wherein $T_1$ is lower than $T_2$ by at least 100° C., whereby the semiconductor precipitates out of the at least a portion of the molten solution and grows as a floating semiconductor foil over an interfacial area of a top surface of the at least a portion of the molten solution, wherein the interfacial area is larger than an area of a cross-section of the semiconductor foil, the cross-section being taken in a plane parallel to a thickness of the semiconductor foil and perpendicular to the interfacial area, along a width of the floating semiconductor foil; and
   separating at least a portion of the floating semiconductor foil from the interfacial area when the thickness of the at least a portion of the floating semiconductor foil is in a range from about 10 micrometers to about 200 micrometers, said thickness is measured along a direction perpendicular to the interfacial area.

2. The method of claim 1 wherein the separating is carried out at temperature $T_1$.

3. The method of claim 1 wherein said molten metallic bath comprises one or more metals selected from a group consisting of In, Sn, Ga, Al, Zn, and Pb.

4. The method of claim 3 wherein said molten metallic bath comprises one or more metals selected from a group consisting of In, Sn, and Ga.

5. The method of claim 1 wherein the separating is carried out when the thickness of the at least a portion of the floating semiconductor foil is in a range from about 30 micrometers to about 150 micrometers.

6. The method of claim 5 wherein the separating is carried out when the thickness of the at least a portion of the floating semiconductor foil is in a range from about 30 micrometers to about 100 micrometers.

7. The method of claim 1 wherein the semiconductor foil comprises a semiconductor selected from a group consisting of Si, Ge, Si—Ge, GaAs, InP, InSb, GaP, AlGaAs, AlGaP, and mixtures thereof.

8. The method of claim 1 wherein the semiconductor foil comprises a semiconductor selected from a group consisting of GaAs, InP, InSb, GaP, AlGaAs, AlGaP, and mixtures thereof.

9. The method of claim 1 wherein the semiconductor foil comprises a multilayer combination of two or three semiconductors.

10. The method of claim 9 wherein the multilayer combination comprises a multilayer combination selected from a group consisting of Si/Ge, GaAs/Si, GaAs/Ge.

11. The method of claim 1 wherein:
    cooling comprises flowing at least a portion of the molten solution along a length of a channel, from a point along the channel where the at least a portion is at a temperature $T_2$ to a point along the channel where the at least a portion has been cooled to temperature $T_1$, thereby forming a floating semiconductor ribbon, said channel having a width perpendicular to the length of the channel; and
    separating comprises pulling the floating semiconductor foil along a direction substantially parallel to the length of the channel and to a plane of the interfacial area.

12. The method of claim 11 wherein the pulling has a rate that is slow enough so that the floating semiconductor ribbon has a width close to the width of the channel.

13. The method of claim 12 wherein the width of the channel is larger than about 1 meter, and the width of the floating semiconductor ribbon is larger than about 1 meter.

14. The method of claim 11 wherein the pulling is at a rate of between 0.1 to about 1.0 meter/minute.

15. The method of claim 1 further comprising:
    after dissolving, pouring at least a portion of the molten solution into a tray having a predetermined area and shape, wherein the at least a portion of the molten solution has a top surface area and shape substantially the same as the predetermined area and shape of the tray; and
    cooling comprises cooling the molten solution in the tray to the lower temperature $T_1$, whereby the floating semiconductor foil is a panel having an interfacial area and shape substantially the same as the predetermined area and shape of the tray.

16. The method of claim 1 further comprising:
    prior to dissolving, providing a molten metallic bath at temperature $T_2$ in a tray having a predetermined area and shape;
    dissolving the semiconductor source material in the molten metallic bath at $T_2$ to form a molten solution in the tray, wherein the molten solution has a top surface area and shape substantially the same as the predetermined area and shape of the tray; and cooling comprises cooling the molten solution in the tray to the lower temperature $T_1$, whereby the floating semiconductor foil is a panel having an interfacial area and shape substantially the same as the predetermined area and shape of the tray.

17. The method of claim 15 wherein the semiconductor panel is substantially a rectangle having a width and a length larger than about 1 meter.

18. The method of claim 16 wherein the semiconductor panel is substantially a rectangle having a width and a length larger than about 1 meter.

19. The method of claim 1 wherein cooling further comprises cooling the at least a portion of the molten solution slowly enough so that the semiconductor foil is substantially single-crystalline.

20. The method of claim 19 which further comprises:
prior to cooling, floating a piece of single-crystal semiconductor on the top surface of the at least a portion of the molten solution.

21. The method of claim 1 which further comprises:
prior to cooling, floating a piece of single-crystal semiconductor on the top surface of the at least a portion of the molten solution.

22. The method of claim 1 wherein cooling further comprises controlling a rate of cooling the molten solution so that the semiconductor foil is a multicrystalline foil wherein at least some grains have at least one dimension in a plane perpendicular to the thickness that is larger than one hundred micrometers.

23. The method of claim 22, wherein the at least one dimension is larger than one millimeter.

24. The method of claim 23 wherein the at least one dimension is larger than seven millimeters.

25. A semiconductor foil produced by the method of claim 1, wherein the semiconductor foil is substantially free of dislocations.

26. A semiconductor foil produced by the method of claim 1, wherein the semiconductor foil has a flat and smooth surface.

27. A semiconductor foil produced by the method of claim 1, wherein the semiconductor foil contains carbon impurity amount below 50 parts per billion.

28. A semiconductor foil produced by the method of claim 1, wherein the semiconductor foil contains iron (Fe) impurity amount below 1 parts per million.

29. A semiconductor foil produced by the method of claim 1, wherein the semiconductor foil contains most metallic impurity amounts below 0.1 parts per million.

* * * * *